(12) United States Patent
Tsai et al.

(10) Patent No.: US 10,693,004 B2
(45) Date of Patent: Jun. 23, 2020

(54) VIA STRUCTURE WITH LOW RESISTIVITY AND METHOD FOR FORMING THE SAME

(71) Applicant: Taiwan Semiconductor Manufacturing Co., Ltd., Hsinchu (TW)

(72) Inventors: Kuo-Chiang Tsai, Hsinchu (TW); Fu-Hsiang Su, Zhubei (TW); Ke-Jing Yu, Kaohsiung (TW); Chih-Hong Hwang, New Taipei (TW); Jyh-Huei Chen, Hsinchu (TW)

(73) Assignee: Taiwan Semiconductor Manufactruing Co., Ltd., Hsinchu (TW)

( * ) Notice: Subject to any disclaimer, the term of this patent is extended or adjusted under 35 U.S.C. 154(b) by 0 days.

(21) Appl. No.: 16/163,970

(22) Filed: Oct. 18, 2018

(65) Prior Publication Data
US 2020/0058785 A1     Feb. 20, 2020

Related U.S. Application Data

(60) Provisional application No. 62/718,808, filed on Aug. 14, 2018.

(51) Int. Cl.
| | |
|---|---|
| *H01L 29/78* | (2006.01) |
| *H01L 29/66* | (2006.01) |
| *H01L 29/423* | (2006.01) |
| *H01L 29/417* | (2006.01) |
| *H01L 21/48* | (2006.01) |

(Continued)

(52) U.S. Cl.
CPC .......... *H01L 29/785* (2013.01); *H01L 21/486* (2013.01); *H01L 21/76805* (2013.01); *H01L 23/5226* (2013.01); *H01L 29/41791* (2013.01); *H01L 29/4232* (2013.01); *H01L 29/66795* (2013.01); *H01L 2029/7858* (2013.01)

(58) Field of Classification Search
CPC .............. H01L 29/785; H01L 29/4232; H01L 29/41791; H01L 29/66795; H01L 23/5226; H01L 21/76805; H01L 21/486
USPC ................. 257/365, 347, 369, 371, 401, 77, 257/E29.255, E29.345, E27.06, E27.111, 257/E21.409, E21.616, E21.703; 438/269, 151, 197, 229, 268, 283
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Dao H Nguyen
(74) *Attorney, Agent, or Firm* — Birch, Stewart, Kolasch & Birch, LLP

(57) ABSTRACT

A semiconductor device structure is provided. The semiconductor device structure includes a gate stack over a substrate and an insulating capping layer over the gate stack. The semiconductor device structure also includes a source/drain contact structure adjacent to the gate stack and having an upper surface that is substantially level with the upper surface of the insulating capping layer. The semiconductor device structure also includes a first via structure passing through the insulating capping layer and electrically connected to the gate stack, and a second via structure above and electrically connected to the source/drain contact structure. The first via structure and the second via structure have different vertical heights.

20 Claims, 12 Drawing Sheets

(51) Int. Cl.
*H01L 21/768* (2006.01)
*H01L 23/522* (2006.01)

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0032275 A1* | 2/2012 | Haran ............... H01L 21/28518 257/401 |
| 2015/0221642 A1* | 8/2015 | Liaw ..................... H01L 27/11 257/401 |
| 2015/0380305 A1* | 12/2015 | Basker ............. H01L 21/76846 257/77 |
| 2016/0284641 A1* | 9/2016 | Liou .................. H01L 23/5226 |
| 2017/0222008 A1* | 8/2017 | Hsu .................. H01L 29/66795 |
| 2017/0278747 A1* | 9/2017 | Adusumilli ....... H01L 21/76897 |

* cited by examiner

VIA STRUCTURE WITH LOW RESISTIVITY AND METHOD FOR FORMING THE SAME

PRIORITY CLAIM AND CROSS-REFERENCE

This Application claims the benefit of U.S. Provisional Application No. 62/718,808, filed on Aug. 14, 2018, and entitled "Interconnect structure with low resistivity and method for forming the same", the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and raising the current flow.

However, although existing FinFET manufacturing processes have generally been adequate for their intended purposes, as device scaling-down continues, they have not been entirely satisfactory in all respects. For example, it is a challenge to form reliable via and contact structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
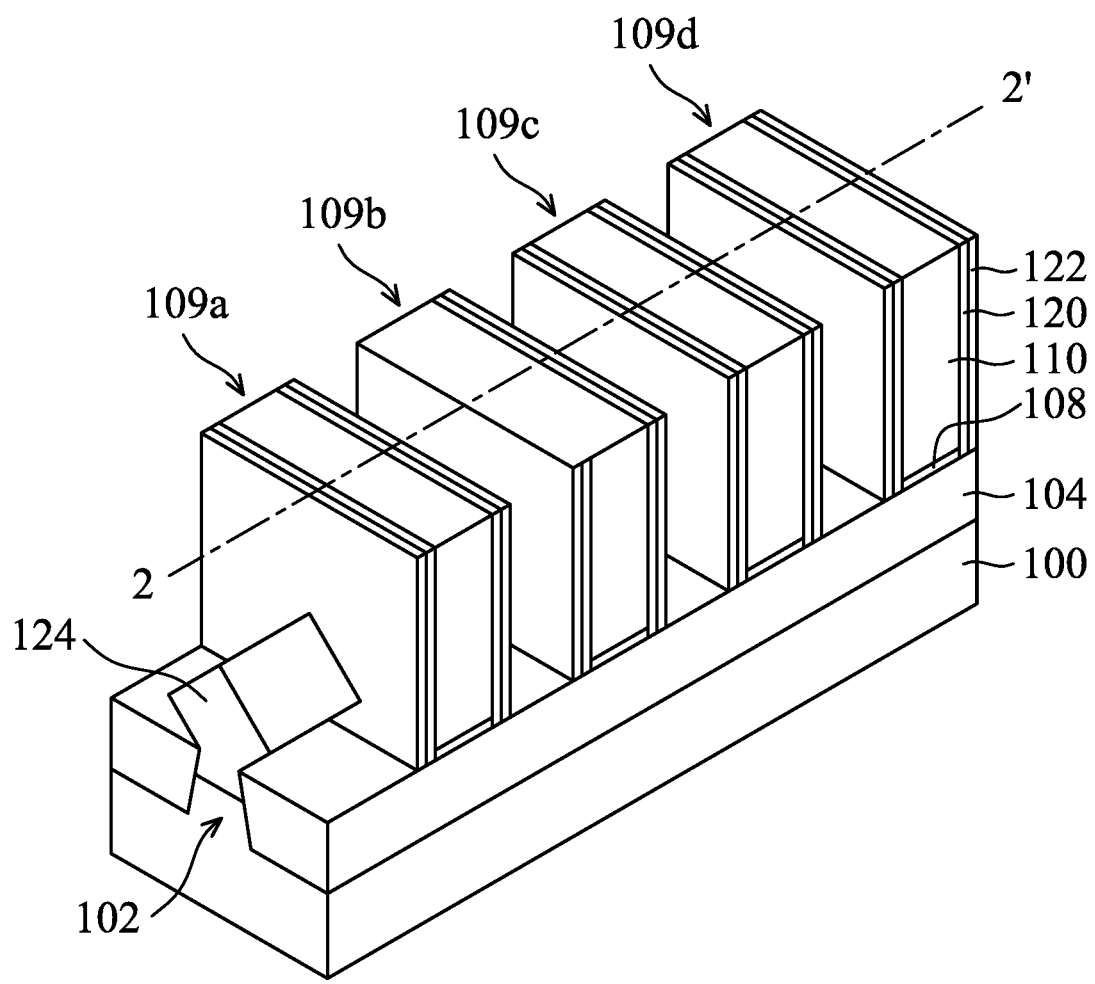
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include an insulating capping layer formed over a gate stack over a substrate, and a self-aligned contact structure formed over a source/drain structure adjacent to and protruding above the gate stack. A first via structure may be formed over and electrically connected to the gate stack. A second via structure may be formed over and electrically connected to the self-aligned contact structure without recessing the self-aligned contact structure and forming a capping layer over the self-aligned contact structure. As a result, the processes for manufacturing the semiconductor device structure may be simplified, and the resistances of the self-aligned contact structure and the overlying second via structure may be reduced.

FIGS. 1A to 1D illustrate perspective views of various stages of manufacturing a semiconductor device structure and FIGS. 2A to 2M illustrate cross-sectional representations of various stages of manufacturing the semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure. As show in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, a fin structure 102 is formed over a substrate 100 in accordance with some embodiments. In some embodiments, the fin structure 102 is formed by patterning the substrate 100. The fin structure 102 may have slope sidewalls, so that the fin structure 102 has a top portion with a width that is narrower than that of the bottom portion, as shown in FIG. 1A.

After the fin structure 102 is formed, an isolation feature 104, such as an shallow trench isolation (STI) structure, is formed over the substrate 100, as shown in FIG. 1A in accordance with some embodiments. The fin structure 102 is surrounded by the isolation feature 104. The isolation feature 104 may be formed by depositing an insulating layer over the substrate 100 and recessing the insulating layer. In some embodiments, the isolation feature 104 is made of silicon oxide, silicon nitride, silicon oxynitride, fluorosilicate glass (FSG), low-K dielectric materials, and/or another suitable dielectric material. The insulating liner for formation of the isolation feature 104 may be deposited by a flowable CVD (FCVD) process, a chemical vapor deposition (CVD) process, an atomic layer deposition (ALD) process, or another applicable process.

Next, dummy gate structures 109a, 109b, 109c, and 109d are formed across the fin structure 102 over the substrate 100 and cover the isolation feature 104, as shown in FIG. 1A in accordance with some embodiments. In some embodiments, each of the dummy gate structures 109a, 109b, 109c, and 109d include a dummy gate dielectric layer 108 and a dummy gate electrode layer 110 formed over the dummy gate dielectric layer 108. In some embodiments, the dummy gate dielectric layer 108 is made of silicon oxide. In some embodiments, the dummy gate electrode layer 110 is made of polysilicon.

Figure 2A:
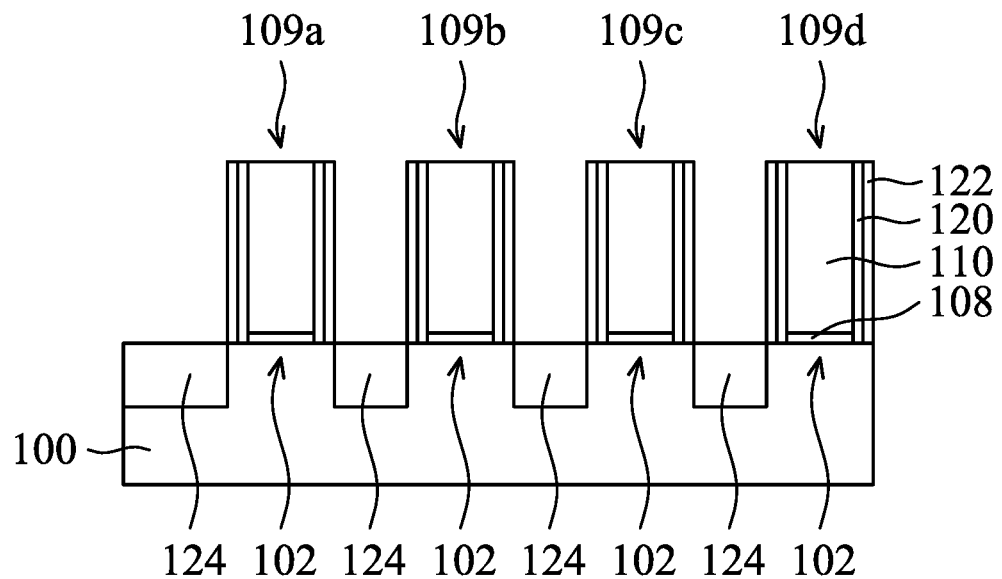
FIGS. 2A to 2M illustrate cross-sectional representations of various stages of manufacturing the semiconductor device structure in accordance with some embodiments.

After the dummy gate structures 109a, 109b, 109c, and 109d are formed, gate spacers are formed on the opposite sides (e.g., sidewalls) of the dummy gate structures 109a, 109b, 109c, and 109d. Each of the gate spacers includes a first spacer layer 120 adjacent to the corresponding dummy gate structure and a second spacer layer 122 adjacent to the first spacer layer 120, as shown in FIGS. 1A and 2A in accordance with some embodiments. The first spacer layer 120 may be used for protecting dummy gate structure 109a, 109b, 109c, and 109d from damage or loss during subsequent processing. In some embodiments, the first spacer layers 120 are made of low-K dielectric materials, silicon nitride, silicon oxide, silicon oxynitride, silicon carbide, or another applicable dielectric material. The first spacer layer 120 may include a single layer or multiple layers.

The second spacer layer 122 is formed on the corresponding first spacer layer 120 in accordance with some embodiments. In some embodiments, the second spacer layer 122 is made of a material that is different from that of the first spacer layer 120, and includes silicon nitride, silicon oxide, silicon carbide, silicon oxynitride, or another applicable material.

After formation of the gate spacers, source/drain features 124 are formed in the fin structure 104 adjacent to and exposed from the dummy gate structures 109a, 109b, 109c, and 109d, as shown in FIGS. 1A and 2A in accordance with some embodiments. In some embodiments, the source/drain structures 114 is formed by recessing the fin structure 102 exposed from the dummy gate structures 109a, 109b, 109c, and 109d and growing semiconductor materials in the formed recesses in the fin structure 102 by performing epitaxial (epi) growth processes. In some embodiments, the semiconductor device structure is an NMOS device, and the source/drain feature 124 includes Si, SiP, SiC, SiPC, or an III-V group semiconductor material (such as InP, GaAs, AlAs, InAs, InAlAs, or InGaAs), or the like. In some embodiments, the semiconductor device structure is a PMOS device, and the source/drain feature 124 includes Si, SiGe, SiGeB, or an group semiconductor material (such as InSb, GaSb, or InGaSb), or the like. In some embodiments, the source/drain features 124 protrude above the isolation feature 104.

Figure 1B:
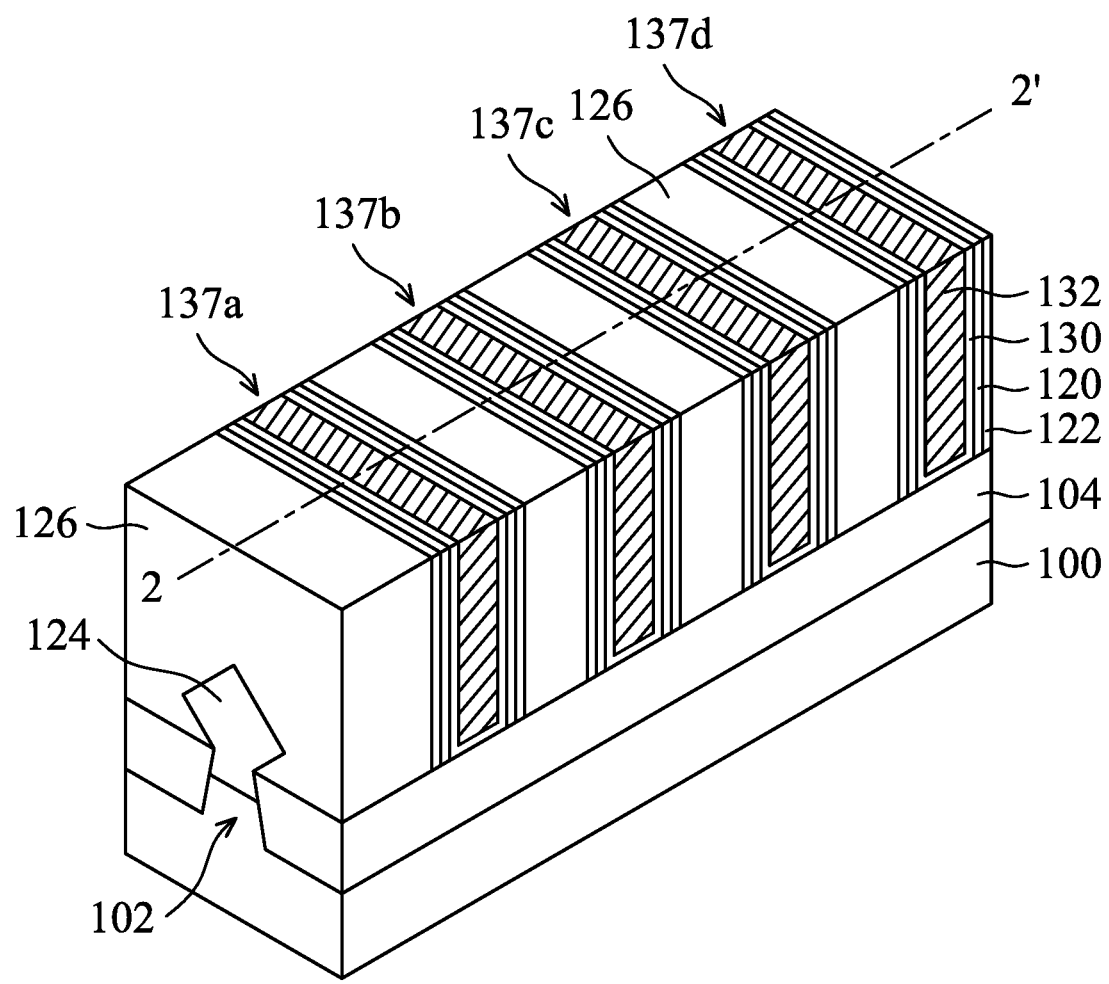
Figure 2B:
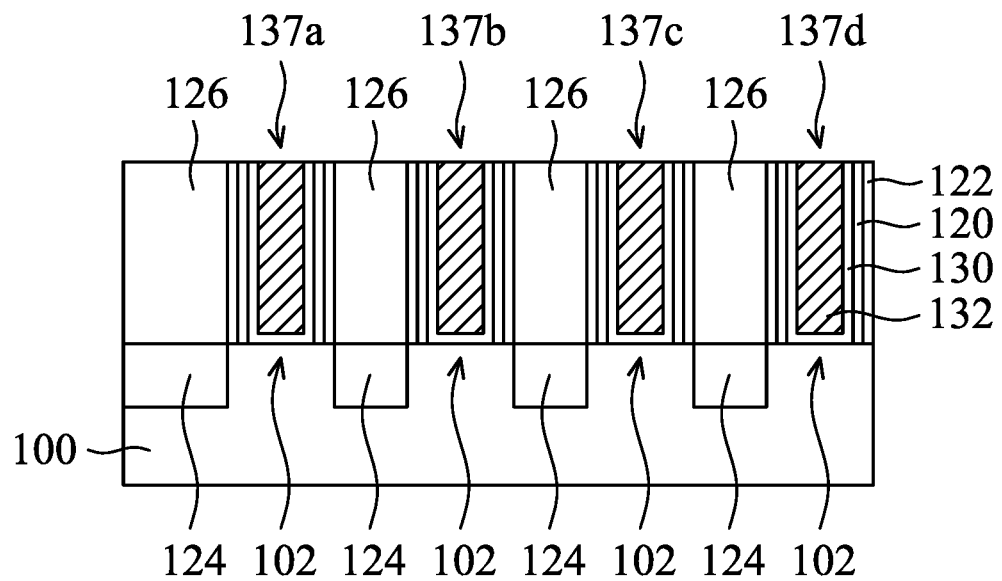

After the source/drain features 124 are formed, an insulating layer 126 is formed over the isolation feature 104 and covers the source/drain features 124 and the isolation feature 104, as shown in FIGS. 1B and 2B in accordance with some embodiments. The insulating layer 126 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like, and may be deposited by any suitable method, such as a chemical vapor deposition (CVD) process, a plasma enhanced CVD (PECVD) process, flowable CVD (FCVD) process, the like, or a combination thereof. The insulating layer 126 may be a single layer or include multiple dielectric layers with the same or different dielectric materials.

Afterwards, the dummy gate structures 109a, 109b, 109c, and 109d are removed, so as to be replaced by gate structures 137a, 137b, 137c, and 137d, as shown in FIGS. 1B and 2B in accordance with some embodiments. In some embodiments, each of the gate structures 137a, 137b, 137c, and 137d includes a gate dielectric layer 130, a gate electrode layer 132, and gate spacers including the first spacer layer 120 and the second spacer layer 122. In some embodiments, the gate dielectric layer 130 is made of high-K dielectric materials, such as metal oxides, metal nitrides, metal silicates, transition metal-oxides, transition metal-nitrides, transition metal-silicates, or oxynitrides of metals. Examples of the high-K dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material.

In some embodiments, the gate electrode layer 132 is made of a conductive material, such as aluminum, copper, tungsten, titanium, tantalum, or another applicable material. Each of the gate structures 137a, 137b, 137c, and 137d may further include a work functional metal layer (not shown) between the gate dielectric layer 130 and the gate electrode layer 132, so that the gate structures 137a, 137b, 137c, and 137d have the proper work function values. An exemplary p-type work function metal layer may be made of TiN, TaN, Ru, Mo, Al, WN, $ZrSi_2$, $MoSi_2$, $TaSi_2$, $NiSi_2$, WN, or a combination thereof. An exemplary n-type work function metal layer may be made of Ti, Ag, TaAl, TaAlC, TiAlN, TaC, TaCN, TaSiN, Mn, Zr, or a combination thereof.

Figure 1C:
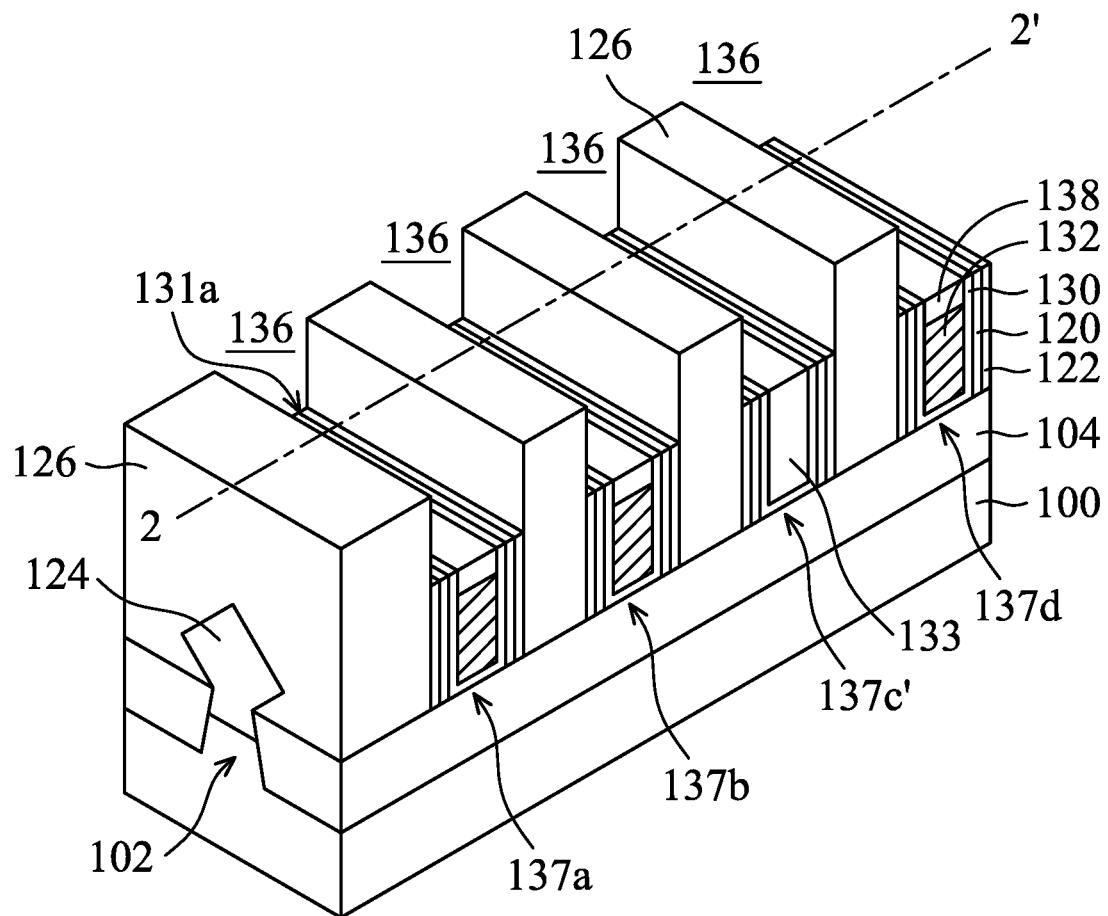
Figure 2C:
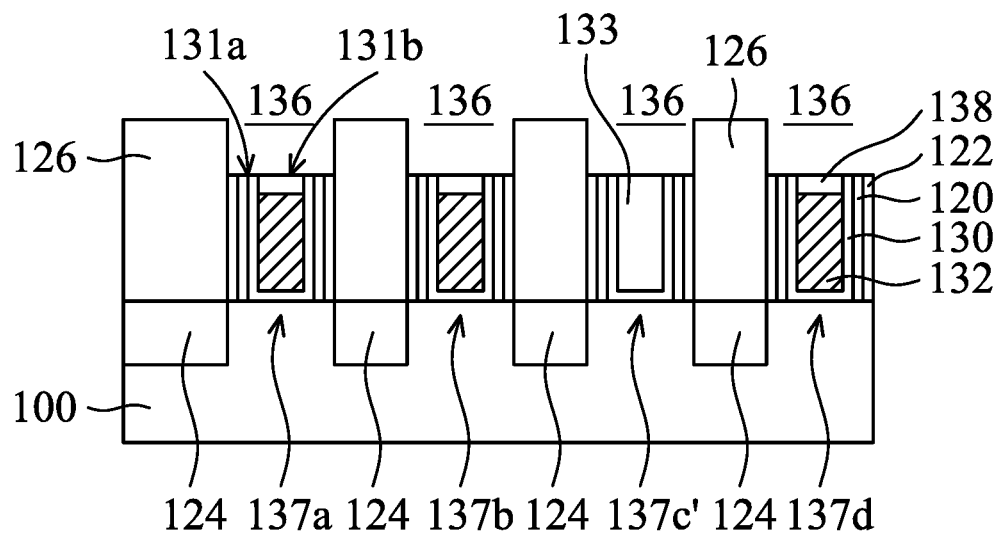

Afterwards, the gate structures 137a, 137b, 137c, and 137d are recessed by etching, so as to form recesses 136, as shown in FIGS. 1C and 2C in accordance with some embodiments. During the etching, top portions of the gate dielectric layers 130, the gate spacers (i.e., the first spacer layers 120, and second spacer layers 122) are also recessed, so that upper sidewalls of the insulating layer 126 are exposed by the recesses 136 in accordance with some embodiments.

In some embodiments, each of the gate electrode layers 122 is further recessed by etching after the upper sidewalls of the insulating layer 126 are exposed, so that the recesses 136 are extended and the upper surface 131a of each gate spacer is higher than the upper surface of the corresponding gate electrode layer 122, as shown in FIGS. 1C and 2C in accordance with some embodiments.

Afterwards, a conductive capping layer 138 is formed to cover each of the recessed gate electrode layers 122 in FIGS. 1C and 2C in accordance with some embodiments. The conductive capping layers 138 and the underlying gate electrode layers 122 form gate stacks of the gate structures 137a, 137b, 137c, and 137d. In some embodiments, the upper surface 131a of each gate spacer is substantially level with the upper surface 131b of each gate stack. In some embodiments, the conductive capping layers 138 serve as etch stop layers or protective layers for protecting the gate electrode layers 122 from damage or loss during subsequent processing, and are made of a metal material, such as tungsten or fluorine-free tungsten.

After the conductive capping layers 138 are formed, a gate cut process is performed to remove one or more gate stacks of the gate structures 137a, 137b, 137c, and 137d in accordance with some embodiments. In some embodiments, the gate stack of the gate structure 137c is removed by etching during the gate cut process, as shown in FIGS. 1C and 2C. Afterwards, an insulating material 133 fills the space that is formed by the removal of the gate stack of the gate structure 137c to form an insulating gate-cut structure 137c'. The insulating gate-cut structure 137c' includes the gate dielectric layer 130, the insulating material 133, and gate spacers including the first spacer layers 120 and the second spacer layers 122.

In some embodiments, the insulating material 133 includes silicon nitride, silicon oxynitride, or silicon carbon nitride, a high-K dielectric material, or the like. Examples of high-K dielectric materials include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and other applicable dielectric materials. In some embodiments, the insulating gate-cut structure 137c' is formed by a chemical vapor deposition (CVD) process, a physical vapor deposition, (PVD) process, or another applicable process.

Figure 1D:
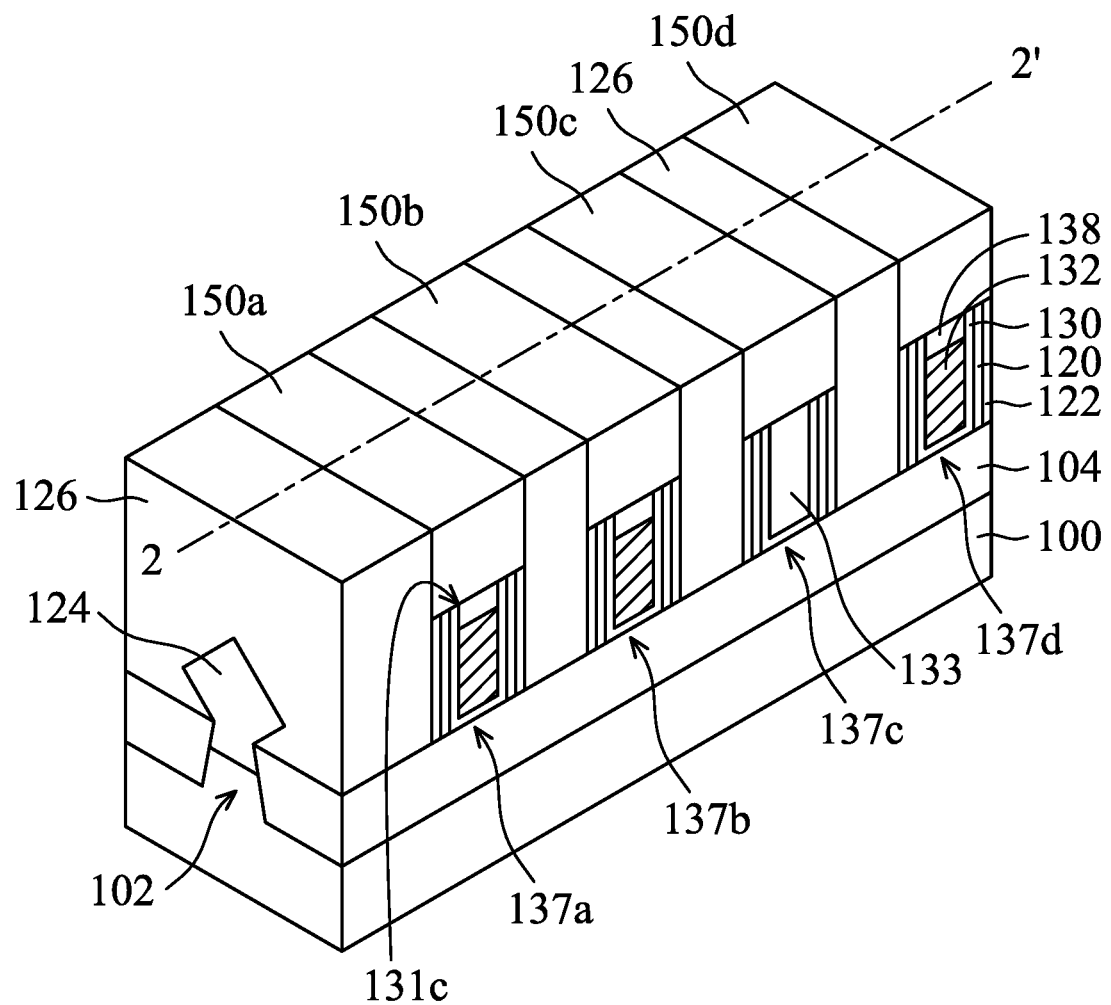
Figure 2D:
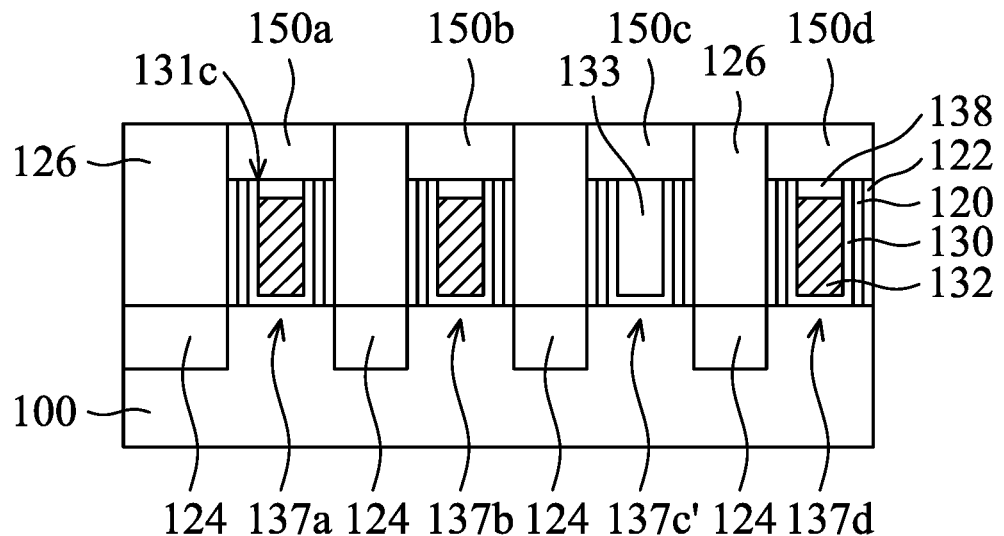

After the gate cut process is performed, insulating capping layers 150a, 150b, 150d, and 150c are respectively formed in the recesses 136 (not shown and as indicated in FIGS. 1C and 2C) over the gate structures 137a, 137b, and 137d, and the insulating gate-cut structure 137c', as shown in FIGS. 1D and 2D in accordance with some embodiments. The insulating capping layers 150a, 150b, and 150d may protect the gate structures 137a, 137b, and 137d in the subsequent manufacturing processes (e.g., etching processes).

In some embodiments, the insulating capping layers 150a, 150b, 150c, and 150d are made of SiON, $Ta_2O_5$, $Al_2O_3$, or $ZrO_2$. In some other embodiments, the insulating capping layers 150a, 150b, 150c, and 150d are made of Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material.

In some embodiments, lower surfaces 131c of the insulating capping layers 150a, 150b, 150c, and 15d are substantially level with the upper surfaces 131a (not shown and as indicated in FIGS. 1C and 2C) of the corresponding gate spacers including the first spacer layers 120 and the second spacer layers 122.

Figure 2E:
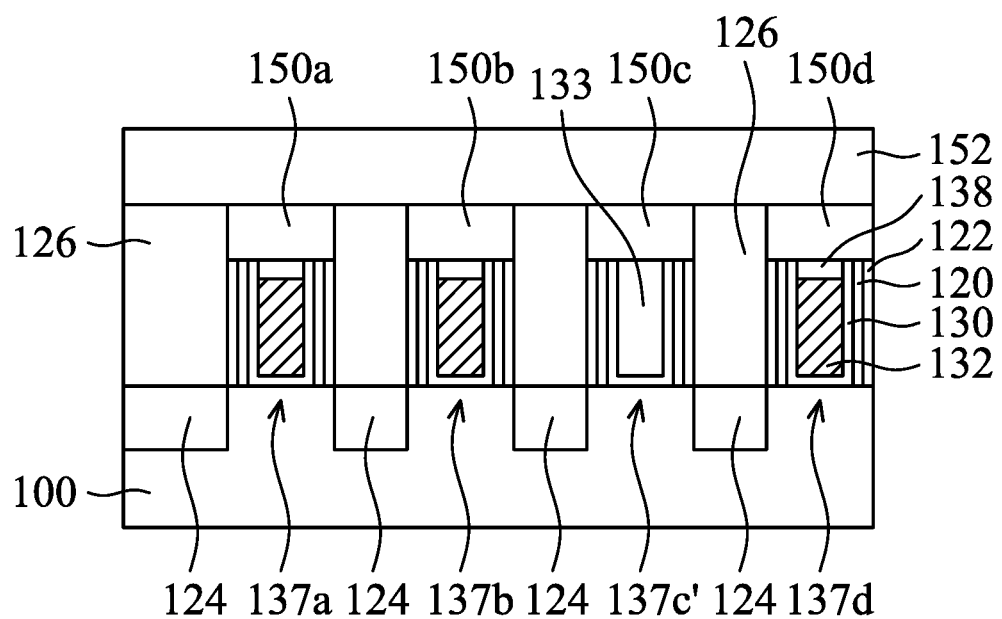

After the insulating capping layers 150a, 150b, 150c, and 150d are formed, a masking layer 152 is formed over the insulating layer 126 and the insulating capping layers 150a, 150b, 150c, and 150d, as shown in FIG. 2E in accordance with some embodiments. In some embodiments, the masking layer 152 includes a tri-layer resist structure including a bottom layer, a middle layer, and a top layer. In order to simplify the diagram, only a flat layer (i.e., the masking layer 152) is depicted.

More specifically, the bottom layer is a first layer of the tri-layer resist structure. The bottom layer may contain a material that is patternable and/or have anti-reflection properties. In some embodiments, the bottom layer is a bottom anti-reflective coating (BARC) layer, such as a nitrogen-free anti-reflective coating (NFARC) layer. In some embodiments, the bottom layer 118 is formed by a spin-on coating process, a chemical vapor deposition (CVD) process, a physical vapor deposition (PVD) process, or another suitable deposition process.

The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon nitride, silicon oxynitride or silicon oxide and is formed by a spin-on coating process, a chemical vapor deposition (CVD) process, a physical vapor deposition (PVD) process, or another suitable deposition process.

The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

Figure 2F:
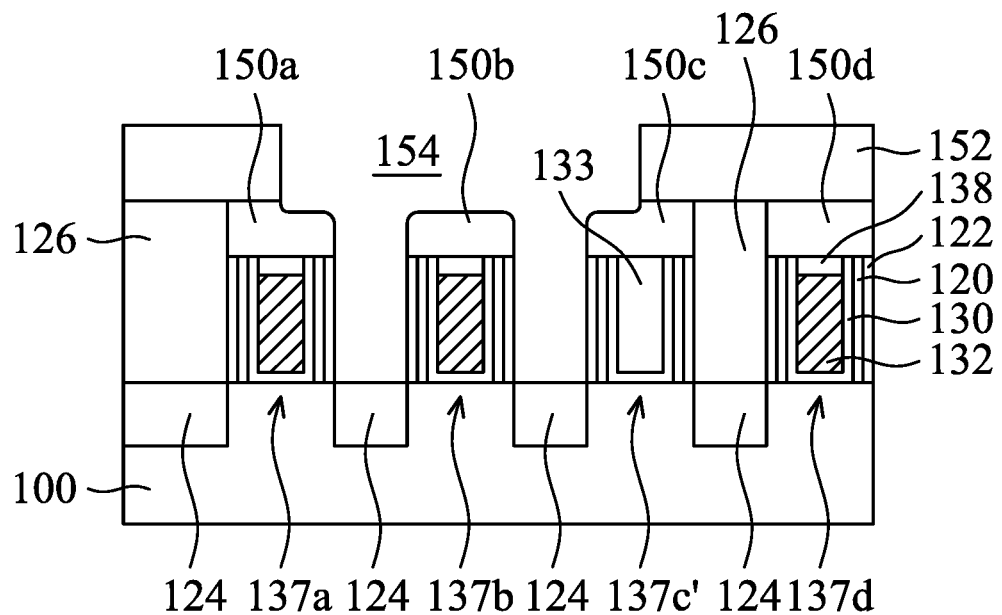

Afterwards, the tri-layer resist structure (i.e., the masking layer 152) is patterned to form a self-aligned opening 154 which is formed through the masking layer 152 and the insulating layer 126 to expose the upper surfaces of some source/drain features 124, as shown in FIG. 2F in accordance with some embodiments. In some embodiments, the self-aligned opening 154 is formed by etching the masking layer 152 and the insulating layer 126 using the insulating capping layers 150a, 150b, and 150c as etch masks, so as to define some source/drain contact regions between the gate structures. For example, the source/drain contact regions are between gate structures 137a and 137b and between gate structure 137b and the insulating gate-cut structure 137c'. Although some portions of the insulating capping layers 150a, 150b, and 150c may also be removed during the etching for formation of the self-aligned opening 154, the gate structures 137a and 137b and the insulating gate-cut structure 137c' are still protected by the insulating capping layers 150a, 150b, and 150c. The source/drain contact regions defined by the self-aligned opening 154 provide a maximum critical dimension (CD) compared to cases where the source/drain contact regions are defined by a non-self-aligned opening. As a result, the resistance (e.g., contact resistance) of the subsequently formed contact structure in those source/drain contact regions defined by the self-aligned opening 154 can be reduced.

After the self-aligned opening 154 is formed, a salicide process may be performed to form salicide layers (not shown) over the exposed upper surfaces of the source/drain features 124. In some embodiments, the salicide layers may be formed by forming a metal layer over the upper surfaces of the source/drain features 124. Afterwards, an annealing process is performed on the metal layer so the metal layer reacts with the source/drain features 124. Afterwards, the unreacted metal layer is removed to form the salicide layers. Examples for forming the metal layer includes Ti, Co, Ni, NiCo, Pt, Ni(Pt), Ir, Pt(Ir), Er, Yb, Pd, Rh, Nb, TiSiN, and the like.

Figure 2G:
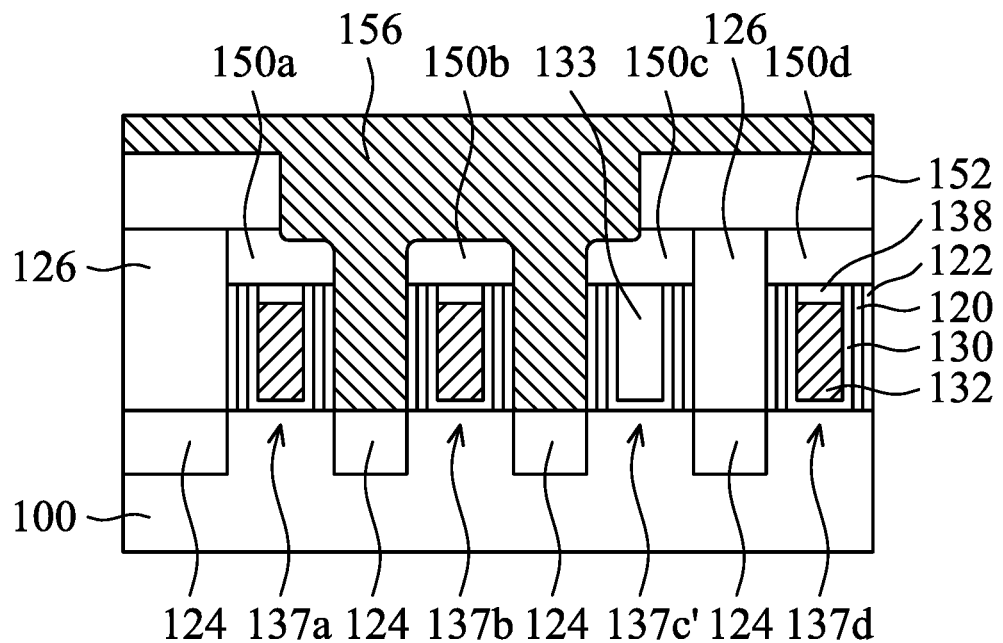

After the self-aligned opening 154 and the salicide layers (if presented) are formed, a conductive material 156 is formed over the masking layer 152 and fills the self-aligned opening 154, as shown in FIG. 2G in accordance with some embodiments. In some embodiments, the conductive material 156 is made of Ru, Ni, Rh, Al, Mo, W, Co, Cu, or metal compound, or the like. The conductive material 156 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Figure 2H:
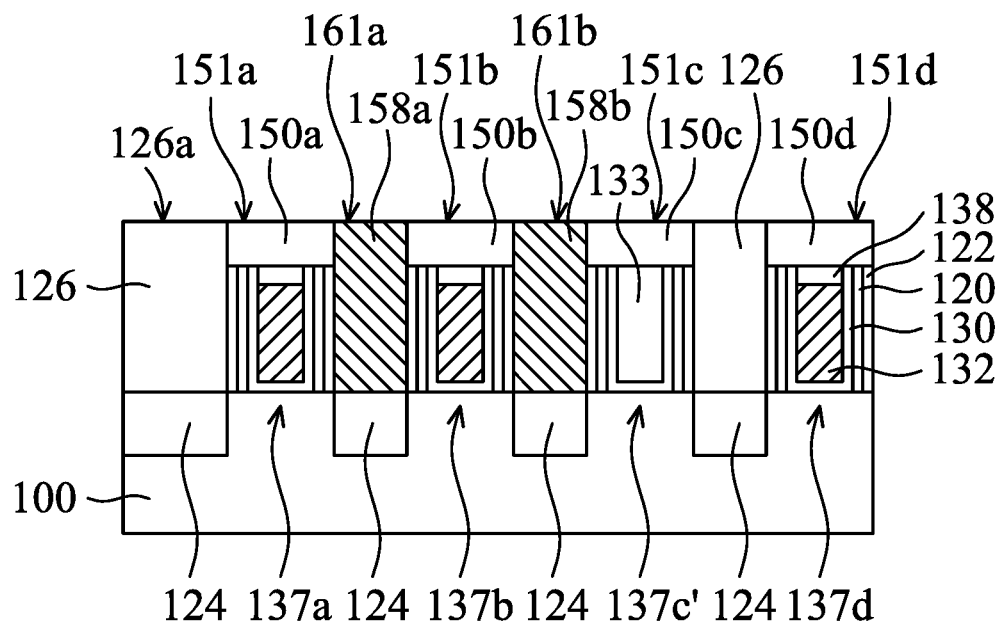

After the conductive material 156 is formed, a polishing process is performed to remove the excess conductive material 156 above the insulating capping layers 150a, 150b, 150c, and 150d and the masking layer 150, as shown in FIG. 2H in accordance with some embodiments. In some embodiments, a polishing process is performed on the conductive material 156 until the insulating capping layers 150a, 150b, 150c, and 150d are exposed. In some embodiments, the polishing process includes a chemical mechanical polishing (CMP) process.

After the polishing process, the remaining conductive material 156 forms a contact structure 158a between and adjacent to the gate structures 137a and 137b and 158b, and a contact structure 158b between and adjacent to the gate structure 137b and the insulating gate-cut structure 137c', as shown in FIG. 2H. Those contact structures 158a and 158b are electrically connected to the corresponding source/drain features 124 and therefore they are also referred to as self-aligned source/drain contact structures or self-aligned source/drain electrodes. The upper surface 161a of the contact structure 158a and the upper surface 161b of the contact structure 158b are substantially level with the upper surface 151a of the insulating capping layer 150a, the upper surface 151b of the insulating capping layer 150b, the upper surface 151c of the insulating capping layer 150c, and the upper surface 151d of the insulating capping layer 150d. As a result, the contact structures 158a and 158b protrude above the gate structures 137a, 137b, and 137d, and the insulating gate-cut structure 137c'. As described previously, the self-aligned opening 154 provides a maximum critical dimension (CD), the resistance (e.g., contact resistance) of the self-aligned source/drain contact structures 158a and 158b can be reduced.

Figure 2I:
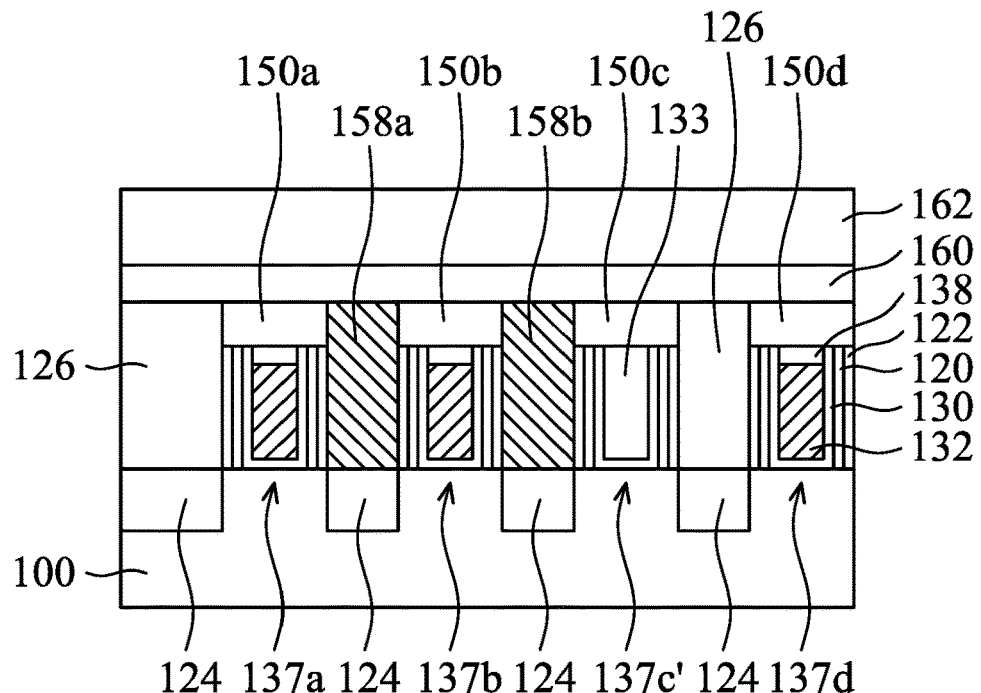

After the contact structures 158a and 158b are formed, insulating layers 160 and 162 are successively formed over the insulating layer 126 and cover the insulating capping layers 150a, 150b, and 150d, and the insulating gate-cut structure 137c', as shown in FIG. 2I in accordance with some embodiments. In some embodiments, the insulating layer 160 serves as an etch stop layer and is made of SiN, SiCN, SiOC, SiON, SiCN, or SiOCN. The insulating layer 160 may be formed by performing a chemical vapor deposition (CVD) process, a plasma enhanced CVD (PECVD) process, low pressure CVD (LPCVD) process, an atomic layer deposition (ALD) process, or another applicable processes.

In some embodiments, the insulating layer 162 includes a single layer or multilayers and is made of $SiO_2$, SiOC, $ZrO_2$, $HfO_2$, or another applicable dielectric material, or a combination thereof. The insulating layer 162 serves as an inter-layer dielectric (ILD) layer and is made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 160 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

Figure 2J:
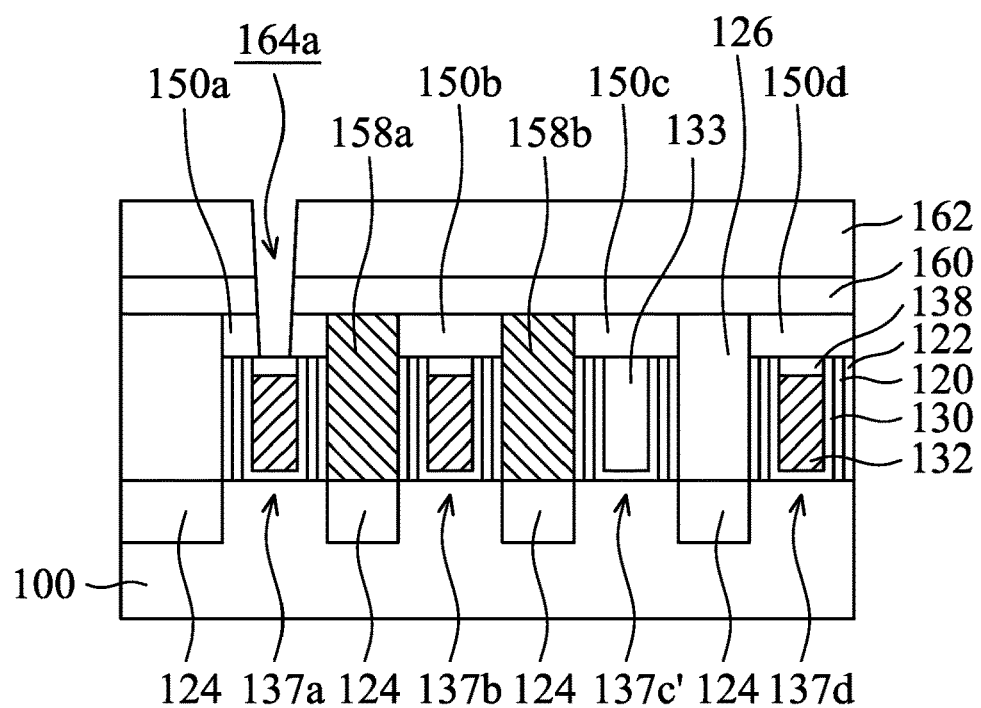

After the insulating layer 162 is formed, a via opening 164a that passes through the insulating layer 162, the insulating layer 160, and the insulating capping layer 150a is formed, so as to expose the upper surface 131b (not shown and as indicated in FIG. 2C) of the gate stack in the gate structure 137a, as shown in FIG. 2J in accordance with some embodiments. In some embodiments, the via opening 164a corresponding to the gate structure 137a is formed by performing photolithography and etching processes. For example, an etching process may be performed using the insulating layer 162 as an etch stop layer after the photolithography process, so that an opening through the insulating layer 162 is formed and the insulating layer 160 is exposed. Afterwards, one or more etching processes may be performed to etch the insulating layer 160 and the insulating capping layer 150a, so as to expose the upper surface of the gate structure 137a (e.g., the upper surface of the conductive capping layer 138 in the gate structure 137a).

Figure 2K:
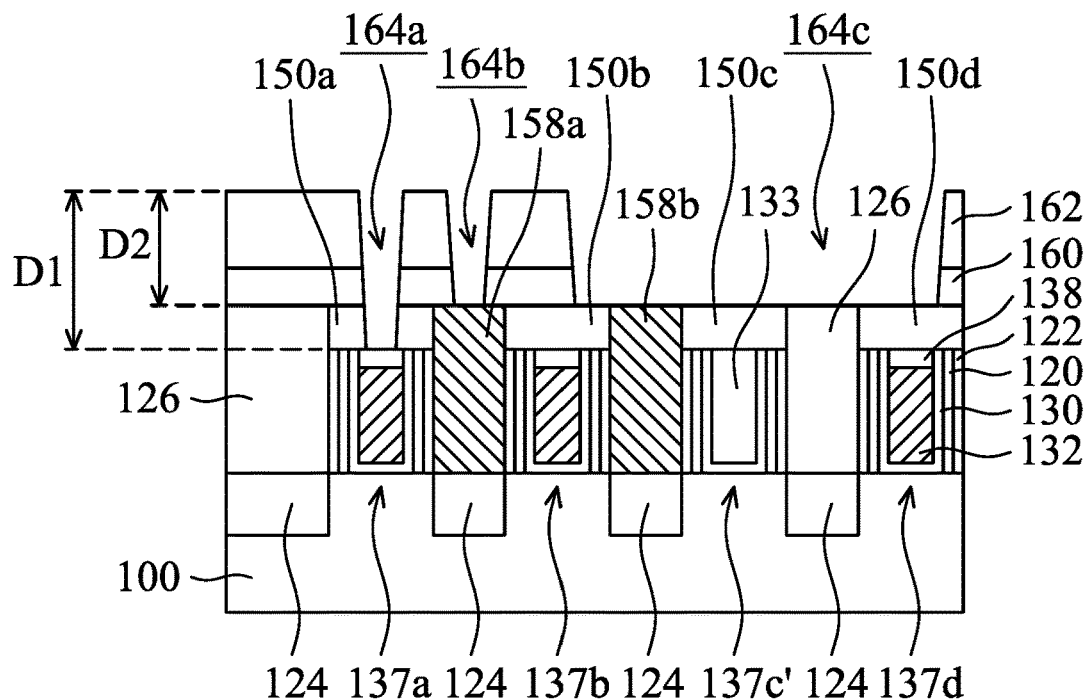

After the via opening 164a is formed, a via opening 164b and a via trench opening 164c that pass through the insulating layer 162 and the insulating layer 160 are formed, as shown in FIG. 2K in accordance with some embodiments. In some embodiments, the upper surface 161a (not shown and as indicated in FIG. 2H) of the contact structure 158a is exposed through the via opening 164b. Moreover, the upper surface 161b (not shown and as indicated in FIG. 2H) of the contact structure 158b, the upper surface 151c (not shown and as indicated in FIG. 2H) of the insulating capping layer 150c, and the upper surface 151d (not shown and as indicated in FIG. 2H) of the insulating capping layer 150d are exposed through the via trench opening 164c.

Similarly, the via opening 164b and a via trench opening 164c respectively corresponding to the contact structures 158a and 158b are formed by performing photolithography and etching processes. For example, an etching process may be performed using the insulating layer 162 as an etch stop layer after the photolithography process, so that openings through the insulating layer 162 are formed and the insulating layer 160 is exposed. Afterwards, another etching process may be performed through the openings to etch the insulating layer 160 until the contact structures 158a and 158b are exposed.

The formed via opening 164a has a depth D1 and the formed via opening 164b and the formed via trench opening 164c have a depth D2 that is different from the depth D1. In some embodiments, the depth D1 of the via opening 164a is greater than the depths D2 of the via opening 164b and the via trench opening 164c, as shown in FIG. 2K in accordance with some embodiments. As a result, the subsequently formed via structures have different vertical heights.

Although the via opening 164a is formed prior to formation of the via opening 164b and the via trench opening 164c, the via opening 164b and the via trench opening 164c may be formed prior to formation of the via opening 164a, in accordance some embodiments.

In addition, although the via opening 164b and the via trench opening 164c are formed simultaneously by the same photolithography and etching processes, the via opening 164b and the via trench opening 164c may be formed by respective photolithography and etching processes, in accordance some embodiments. In those cases, the via opening 164b may be formed before or after the via trench opening 164c is formed.

Figure 2L:
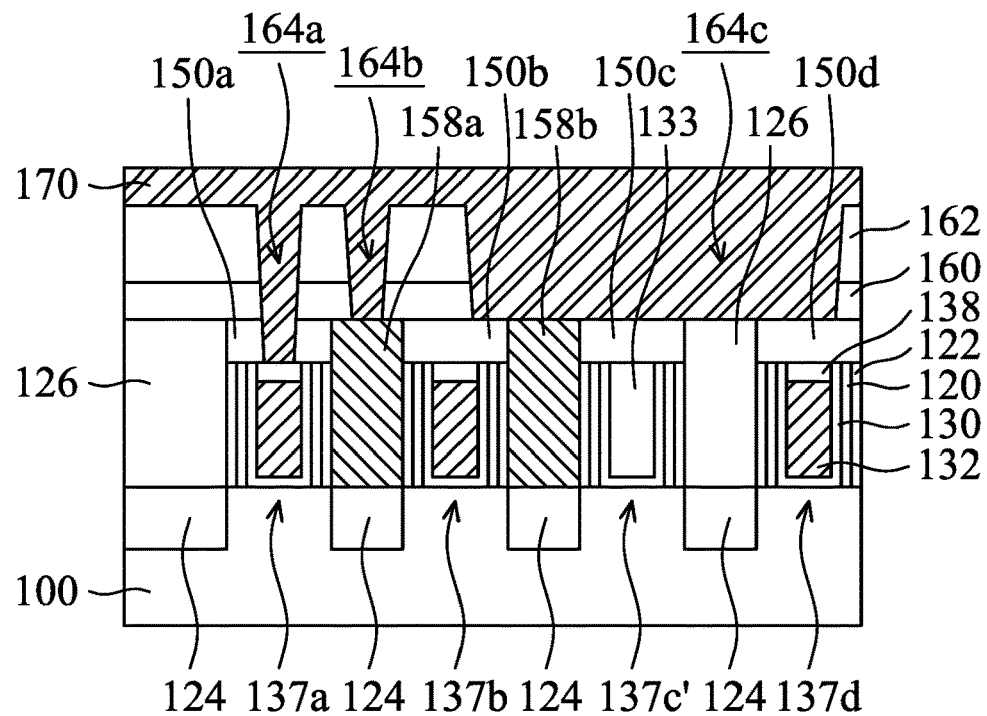

After the via opening 164b, the via opening 164a, and the via trench opening 164c are formed, a conductive material 170 is formed over the insulating layer 162 and fills the via openings 164a and 164b, and the via trench opening 164c, as shown in FIG. 2L in accordance with some embodiments. In some embodiments, the conductive material 170 is made of Ru, Ni, Rh, Al, Mo, W, Co, Cu, or metal compound, or the like. The conductive material 170 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Figure 2M:
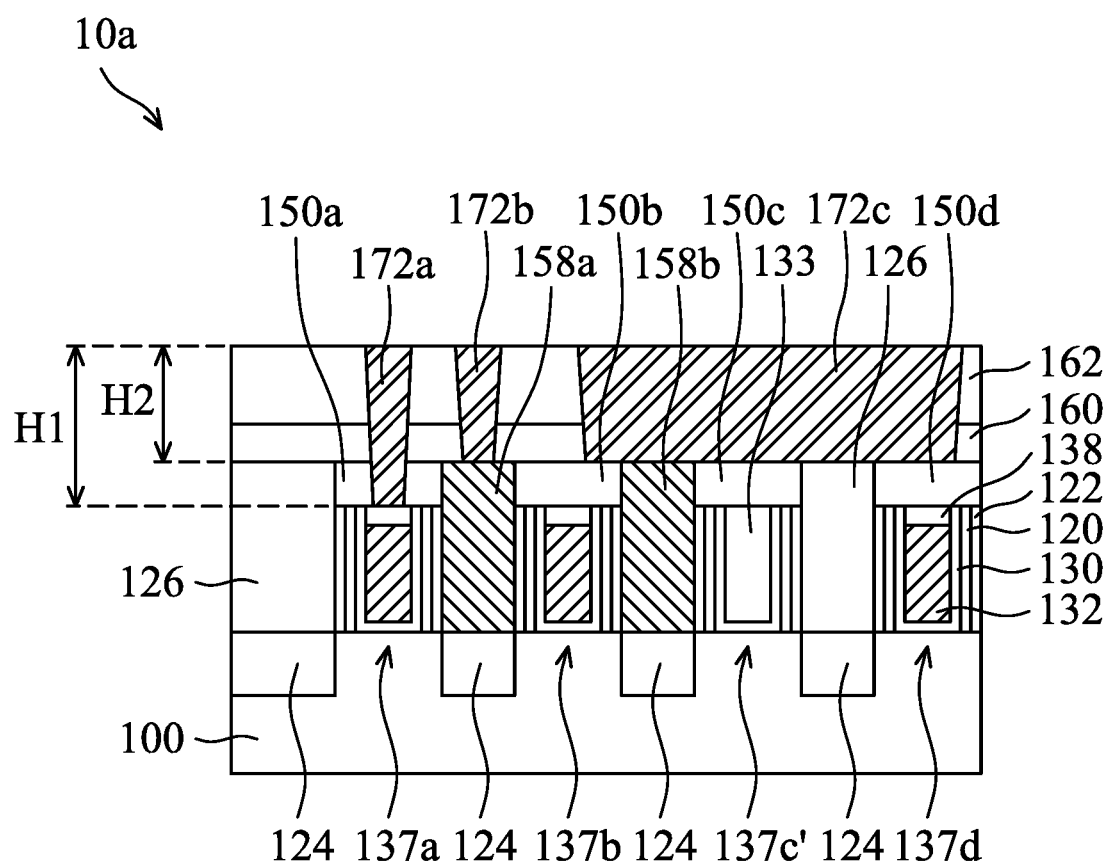

After the conductive material 170 is formed, a polishing process is performed on the conductive material 170 until the upper surface of the insulating layer 162 is exposed, as shown in FIG. 2M in accordance with some embodiments. In some embodiments, the polishing process includes a chemical mechanical polishing (CMP) process. After the polishing process, the remaining conductive material 170 in the via openings 164a and 164b, and the via trench opening 164c forms conductive via structures 172a, 172b, and 172c. As a result, the semiconductor device structure 10a having the gate structures 137a, 137b, and 137c, the contact structures 158a and 158b, and the via structures 172a, 172b, and 172c is formed.

In some embodiments, the via structure 172a in and surrounded by the insulating layers 160 and 162, and the insulating capping layer 150a has a vertical height H1 and is electrically connected to the gate structure 137a via the conductive capping layer 138 that is formed between the gate electrode layer 132 and the via structure 172a, in accordance with some embodiments.

In some embodiments, the via structure 172b and the via structure 172c in and surrounded by the insulating layers 160 and 162 are respectively and electrically connected to the contact structures 158a and 158b, and have a vertical height H2, in accordance with some embodiments. Moreover, the via structure 172c is overlapped with the contact structure 158b, the gate structures 137b and 137d, and the insulating gate-cut structure 137c', in accordance with some embodiments.

In some embodiments, the via structures 172a, 172b, and 172c have upper surfaces that are substantially level with the upper surface of the insulating layer 162, as shown in FIG. 2M. Since the contact structures 158a and 158b protrude above the gate structures 137a, 137b, and 137d, the via structure 172a with the vertical height H1 is vertically longer than the via structures 172b and 172c with the vertical height H2. Accordingly, compared to cases where the upper surface of the contact structures is level with that of the gate structure, the resistance (e.g., the contact resistance) of the via structures 172b and 172c above the contact structures 158a and 158b, respectively, can be reduced.

Figure 3:
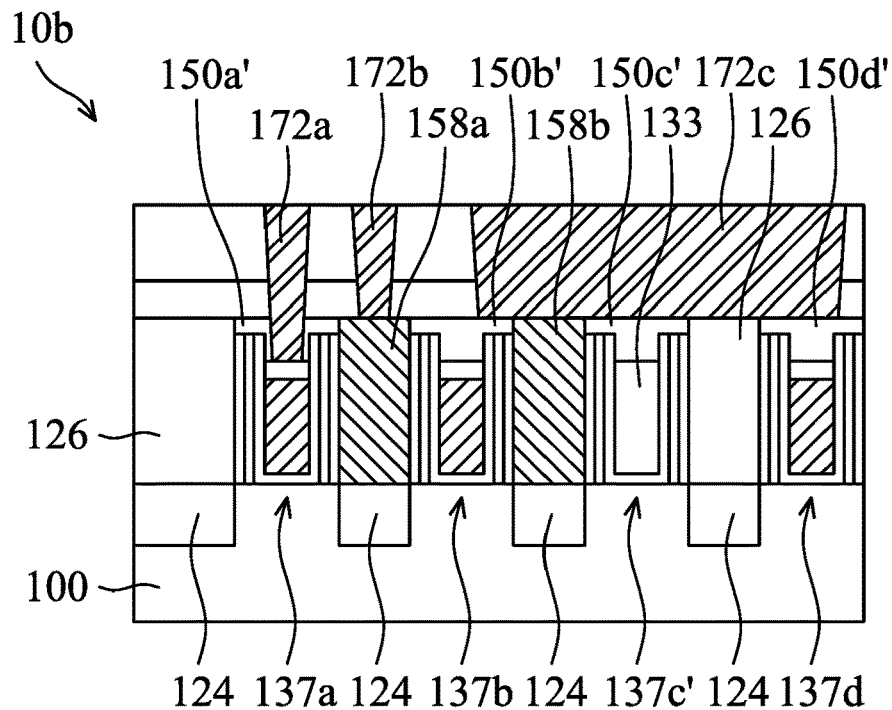
FIG. 3 illustrates a cross-sectional representation of a semiconductor device structure in accordance with some embodiments.

Many variations and/or modifications can be made to embodiments of the disclosure. For example, FIG. 2M shows that the lower surfaces of the insulating capping layers 150a, 150b, 150c, and 150d are substantially level with the upper surfaces of the corresponding gate spacers in the semiconductor device structure 10a, but embodiments of the disclosure are not limited. The upper surfaces of the corresponding gate spacers may not be substantially level with the upper surfaces of the insulating capping layers 150a, 150b, 150c, and 150d. FIG. 3 shows a cross-sectional representation of a semiconductor device structure 10b, in accordance with some embodiments. The semiconductor device structure 10b shown in FIG. 3 is similar to the semiconductor device structure 10a shown in FIG. 2M. In some embodiments, the materials, formation methods, and/or benefits of the semiconductor device structure 10a shown in FIGS. 2A to 2M can also be applied in the embodiments illustrated in FIG. 3, and are therefore not repeated.

Unlike the semiconductor device structure 10a shown in FIG. 2M, the semiconductor device structure 10b shown in FIG. 3 has insulating capping layers 150a', 150b', 150c', and 150d' that have a T-shaped profile, in accordance with some embodiments. More specifically, gate spacers including a first spacer layer 120 and a second spacer layer 122 are formed on opposite sides of the corresponding gate stacks and protrude above the upper surface of the corresponding conductive capping layer 138 or the insulating material 133, so that the subsequently formed insulating capping layers 150a', 150b', 150c', and 150d' have a T-shaped profile, and the upper surfaces of the gate spacers are covered by the corresponding insulating capping layers 150a', 150b', 150c', and 150d'.

Figure 4:
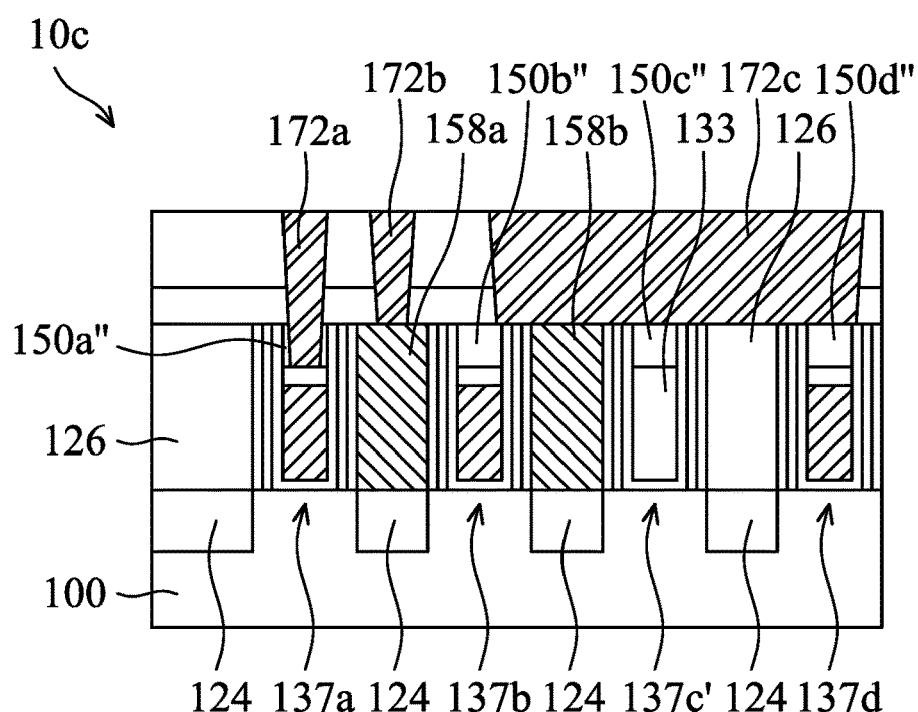
FIG. 4 illustrates a cross-sectional representation of a semiconductor device structure in accordance with some embodiments.

Many variations and/or modifications can be made to embodiments of the disclosure. For example, FIG. 2M shows that the lower surfaces of the insulating capping layers 150a, 150b, 150c, and 150d are substantially level with the upper surfaces of the corresponding gate spacers in the semiconductor device structure 10a, but embodiments of the disclosure are not limited. The upper surfaces of the corresponding gate spacers may not be substantially level with the upper surfaces of the insulating capping layers 150a, 150b, 150c, and 150d. FIG. 4 shows a cross-sectional representation of a semiconductor device structure 10c, in accordance with some embodiments. The semiconductor device structure 10b shown in FIG. 4 is similar to the semiconductor device structure 10a shown in FIG. 2M. In some embodiments, the materials, formation methods, and/or benefits of the semiconductor device structure 10a shown in FIGS. 2A to 2M can also be applied in the embodiments illustrated in FIG. 4, and are therefore not repeated.

Unlike the semiconductor device structure 10a shown in FIG. 2M, the semiconductor device structure 10c shown in FIG. 4 has insulating capping layers 150a'", 150b'", 150c'", and 150d'" and opposite sides of the insulating capping layers 150a'", 150b'", 150c'", and 150d'" are covered by gate spacers, in accordance with some embodiments. More specifically, gate spacers including a first spacer layer 120 and a second spacer layer 122 are formed to cover opposite sides of the corresponding gate stacks and the corresponding insulating capping layers 150a'", 150b'", 150c'", and 150d'". In some embodiments, gate spacers protrude above the upper surface of the corresponding conductive capping layer 138 or the insulating material 133, and have upper surfaces that are substantially level with the upper surface of insulating capping layers 150a'", 150b'", 150c'", and 150d'".

As a result, the insulating capping layer 150a'" is separated from the insulating layer 126 and the contact structure 158a by the gate spacers in the gate structure 137a. Similarly, the insulating capping layer 150b'" is separated from the contact structure 158a and the contact structure 158b by the gate spacers in the gate structure 137b. The insulating capping layer 150c'" is separated from the contact structure 158b and the insulating layer 126 by the gate spacers in the insulating gate-cut structure 137c'. The insulating capping layer 150d'" is separated from the insulating layer 126 by the gate spacers in the insulating gate-cut structure 137d.

Embodiments of semiconductor device structures and methods for forming the same are provided. The formation of the semiconductor device structure includes forming an insulating capping layer over a gate stack. Afterwards, a source/drain contact structure is formed to protrude above the gate stack. Afterwards, first and second via structures with different vertical heights are respectively formed and electrically connected to the gate stack and the source/drain contact structure. The source/drain contact structure provides a maximum critical dimensional (CD) compared to a non-self-aligned contact structure. Since the source/drain contact structure is higher than the gate structure, the vertical height of the second via structure can be reduced with respect to the first via structure. As a result, the resistances of the via structure and the underlying contact structure for the source/drain region can be reduced, thereby improving the device performance.

In some embodiments, a semiconductor device structure is provided. The semiconductor device structure includes a gate stack over a substrate and an insulating capping layer over the gate stack. The semiconductor device structure also includes a source/drain contact structure adjacent to the gate stack and having an upper surface that is substantially level with an upper surface of the insulating capping layer. The semiconductor device structure also includes a first via structure passing through the insulating capping layer and electrically connected to the gate stack, and a second via structure above and electrically connected to the source/drain contact structure. The first via structure and the second via structure have different vertical heights.

In some embodiments, a semiconductor device structure is provided. The semiconductor device structure includes a fin structure over a substrate and a first insulating layer over the substrate and covering the fin structure. The semiconductor device structure also includes a gate structure in the first insulating layer and across the fin structure. The gate structure includes a gate dielectric layer, a gate electrode layer over the gate dielectric layer, a conductive capping layer covering the gate electrode layer, and gate spacers on opposite sidewalls of the gate electrode layer. The semiconductor device structure also includes a contact structure electrically connected to a source/drain feature in the fin structure and protruding from the upper surface of the conductive capping layer. The semiconductor device structure also includes a second insulating layer over the first insulating layer and covering the gate structure and the contact structure. The semiconductor device structure also includes a first via structure passing through the second insulating layer and electrically connected to the gate structure, and a second via structure passing through the second insulating layer and electrically connected to the contact structure. The first via structure has a vertical height that is higher than the vertical height of the second via structure.

In some embodiments, a method for forming a semiconductor device structure is provided. The method includes forming a first insulating layer over a substrate having a fin structure and forming a gate electrode layer in the first insulating layer and across the fin structure. The method also includes covering the gate electrode layer with an insulating capping layer. The method also includes etching the first insulating layer using the insulating capping layer as an etch mask, so as to form an opening that exposes a source/drain feature in the fin structure. The method also includes forming a contact structure in the opening. The contact structure has an upper surface that is substantially level with an upper surface of the insulating capping layer. The method also includes forming a second insulating layer over the first insulating layer and covering the insulating capping layer and the contact structure. The method also includes forming a first via structure in the second insulating layer and the insulating capping layer. The first via structure is electrically connected to the gate electrode layer. The method also includes forming a second via structure in the second insulating layer. The second via structure is electrically connected to the source/drain feature via the contact structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a gate stack over a substrate;
an insulating capping layer over the gate stack;
gate spacers on opposite sides of the gate stack and capped by the insulating capping layer, wherein one of the gate spacers has a sidewall opposite to gate stack and substantially level with a sidewall of the insulating capping layer, and wherein the gate spacers protrude above the upper surface of the gate stack, and the insulating capping layer has a T-shaped profile and covers upper surfaces of the gate spacers;
a source/drain contact structure adjacent to the gate stack and having an upper surface that is substantially level with an upper surface of the insulating capping layer;
a first via structure passing through the insulating capping layer and electrically connected to the gate stack; and
a second via structure above and electrically connected to the source/drain contact structure, wherein the first via structure and the second via structure have different vertical heights.

2. The semiconductor device structure as claimed in claim 1, wherein gate spacers have upper surfaces that are substantially level with a portion of a lower surface of the insulating capping layer and an upper surface of the gate stack.

3. The semiconductor device structure as claimed in claim 2, wherein the gate stack comprises:
a gate electrode layer; and
a conductive capping layer between the gate electrode layer and the insulating capping layer, so as to form an electrical connection between the gate electrode layer and the first via structure.

4. The semiconductor device structure as claimed in claim 1, wherein the gate stack comprises:
a gate electrode layer; and
a conductive capping layer between the gate electrode layer and the insulating capping layer, so as to form an electrical connection between the gate electrode layer and the first via structure.

5. The semiconductor device structure as claimed in claim 4, further comprising:
a gate dielectric layer separating the conductive capping layer from the gate spacers.

6. The semiconductor device structure as claimed in claim 5, wherein an upper surface of the gate dielectric layer is substantially level with upper surfaces of the gate spacers.

7. The semiconductor device structure as claimed in claim 1, wherein the vertical height of the second via structure is lower than the vertical height of the first via structure.

8. A semiconductor device structure, comprising:
a fin structure over a substrate;
a first insulating layer over the substrate and covering the fin structure;
a gate structure in the first insulating layer and across the fin structure comprising:
a gate dielectric layer;
a gate electrode layer over the gate dielectric layer;
a conductive capping layer covering the gate electrode layer; and
gate spacers on opposite sidewalls of the gate electrode layer;
an insulating capping layer capping the gate spacers, wherein each of the gate spacers has a sidewall opposite to the gate electrode layer, and the sidewalls of the gate spacers are substantially level with opposite sidewalls of the insulating capping layer, respectively, and wherein the gate spacers protrude above the upper surface of the conductive capping layer and have upper surfaces covered by the insulating capping layer;
a contact structure electrically connected to a source/drain feature in the fin structure and protruding from an upper surface of the conductive capping layer;
a second insulating layer over the first insulating layer and covering the gate structure and the contact structure;
a first via structure passing through the second insulating layer and electrically connected to the gate structure; and
a second via structure passing through the second insulating layer and electrically connected to the contact structure, wherein the first via structure has a vertical height that is higher than a vertical height of the second via structure.

9. The semiconductor device structure as claimed in claim 8, wherein the insulating capping layer has an upper surface that is substantially level with an upper surface of the contact structure and an upper surface of the first insulating layer.

10. The semiconductor device structure as claimed in claim 9, wherein the insulating capping layer has a lower surface that is substantially level with the upper surface of the conductive capping layer and upper surfaces of the gate spacers.

11. The semiconductor device structure as claimed in claim 9, wherein the gate spacers cover opposite sides of a portion of the insulating capping layer, so that the portion of the insulating capping layer is separated from the first insulating layer and the contact structure by the gate spacers.

12. The semiconductor device structure as claimed in claim 9, further comprising:
a third insulating layer over the second insulating layer and surrounding the first and second via structures, wherein the third insulating layer has an upper surface that is substantially level with an upper surface of the first via structure and an upper surface of the second via structure.

13. The semiconductor device structure as claimed in claim 8, wherein the conductive capping layer is separated from the gate spacers by the gate dielectric layer.

14. The semiconductor device structure as claimed in claim 13, wherein an upper surface of the gate dielectric layer is substantially level with upper surfaces of the gate spacers.

15. A method for forming a semiconductor device structure, comprising:
forming a first insulating layer over a substrate having a fin structure;
forming gate spacers in the first insulating layer;
forming a gate electrode layer in the first insulating layer and across the fin structure, wherein the gate electrode layer is separated from the first insulating layer by the gate spacers;
capping the gate electrode layer and the gate spacers with an insulating capping layer, wherein one of the gate spacers has a sidewall opposite to the gate electrode layer and substantially level with a sidewall of the insulating capping layer, and wherein the gate spacers protrude above an upper surface of the gate electrode layer and have an upper surface covered by the insulating capping layer;
etching the first insulating layer using the insulating capping layer as an etch mask, so as to form an opening that exposes a source/drain feature in the fin structure;
forming a contact structure in the opening, wherein the contact structure has an upper surface that is substantially level with an upper surface of the insulating capping layer;

forming a second insulating layer over the first insulating layer and covering the insulating capping layer and the contact structure;

forming a first via structure in the second insulating layer and the insulating capping layer, wherein the first via structure is electrically connected to the gate electrode layer; and forming a second via structure in the second insulating layer, wherein the second via structure is electrically connected to the source/drain feature via the contact structure.

16. The method as claimed in claim 15, wherein the second via structure has a vertical height that is lower than a vertical height of the first via structure.

17. The method as claimed in claim 15, further comprising:

forming a conductive capping layer over the gate electrode layer before forming the insulating capping layer, wherein the conductive capping layer is between the gate electrode layer and the insulating capping layer, wherein the insulating capping layer has a lower surface that is substantially level with an upper surface of the conductive capping layer and an upper surface of the gate spacer.

18. The method as claimed in claim 15, further comprising:

forming a third insulating layer over the second insulating layer before forming the first and second via structures, wherein the first and second via structures are formed in the third insulating layer and have upper surfaces that are substantially level with an upper surface of the third insulating layer.

19. The method as claimed in claim 15, wherein the first via structure is separated from the contact structure by the insulating capping layer and the gate spacers.

20. The method as claimed in claim 15, further comprising:

forming a gate dielectric layer in the first insulating layer prior to the formation of the gate electrode layer, wherein an upper surface of the gate dielectric layer is substantially level with upper surfaces of the gate spacers.

\* \* \* \* \*